(12) United States Patent
Chang et al.

(10) Patent No.: US 6,563,154 B1
(45) Date of Patent: May 13, 2003

(54) POLYSILICON LAYER HAVING IMPROVED ROUGHNESS AFTER POCL₃ DOPING

(75) Inventors: Chun-Chieh Chang, Tainan (TW); Yu-Jen Yu, Taipei (TW); Te-Fu Tseng, Hsin-Chu (TW); Chao-Yi Lan, Chung-Li (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/208,915

(22) Filed: Dec. 10, 1998

Related U.S. Application Data

(62) Division of application No. 09/049,212, filed on Mar. 27, 1998, now Pat. No. 5,874,333.

(51) Int. Cl.⁷ ............ H01L 27/108; H01L 29/76; H01L 29/94; H01L 31/119
(52) U.S. Cl. .................. 257/296; 257/314
(58) Field of Search ................ 257/296, 295, 257/300–310, 314–316; 438/396–398, 253–254

(56) References Cited

U.S. PATENT DOCUMENTS

| | | | |
|---|---|---|---|
| 5,286,668 A | 2/1994 | Chou | 437/52 |
| 5,290,729 A | 3/1994 | Hayashide et al. | 437/60 |
| 5,298,436 A * | 3/1994 | Radosevich et al. | 438/396 |
| 5,597,754 A | 1/1997 | Lou et al. | 437/52 |
| 5,639,685 A | 6/1997 | Zahurak et al. | 437/60 |
| 5,663,090 A | 9/1997 | Dennison et al. | 438/398 |
| 5,866,930 A * | 2/1999 | Saida et al. | 257/316 |

OTHER PUBLICATIONS

Page 179 of "Silion Processing for the VLSI Era" vol. 1—Process Technology S. Wolf and R.N. Tauber, 1986.*

* cited by examiner

Primary Examiner—Cuong Quang Nguyen
(74) Attorney, Agent, or Firm—George O. Saile; Stephen B. Ackerman

(57) ABSTRACT

An improved method for depositing the polysilicon layer from which a gate pedestal is later formed is described. Deposition takes place in two stages. Initially, the conventional deposition temperature of about 630° C. is used. Then, when the intended thickness of polysilicon has been grown, the temperature is ramped down to about 560° C., without interrupting the deposition process, and growth of the film continues to completion. This is followed by a standard doping step using POCl₃. Polysilicon films formed in this way have been found to have very smooth surfaces because the topmost layer is less subject to uncontrolled grain growth. As a consequence, dielectric layers obtained by oxidizing such films exhibit superior breakdown voltages.

2 Claims, 3 Drawing Sheets

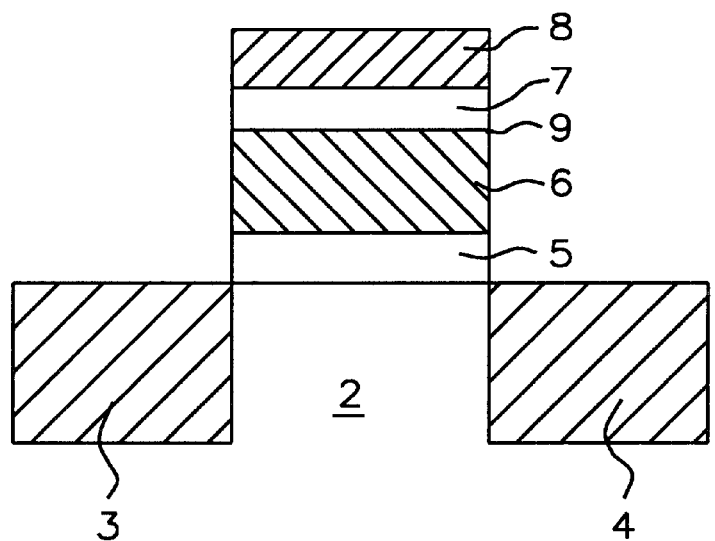
FIG. 1 – Prior Art
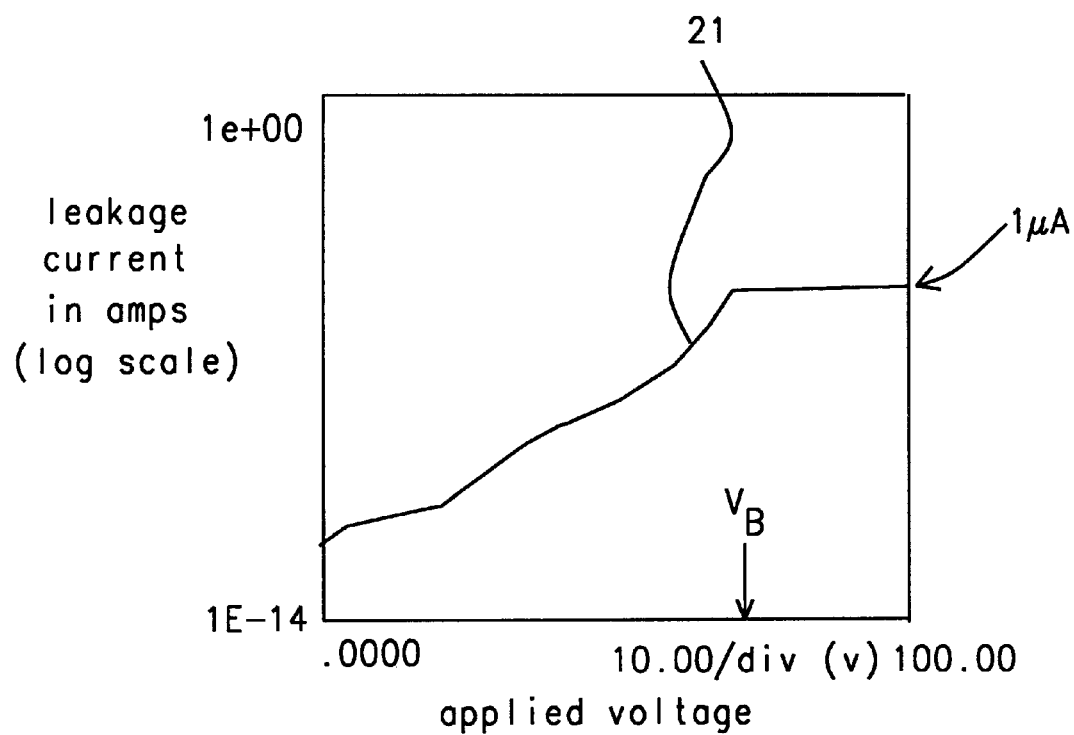
FIG. 2 – Prior Art

POLYSILICON LAYER HAVING IMPROVED ROUGHNESS AFTER POCL$_3$ DOPING

This is a division of patent application Ser. No. 09/049,212, filing date Mar. 27,1998, now U.S. Pat. No. 5,874,333 Polysilicon Layer Having Improved Roughness After POCl$_3$ Doping, assigned to the same assignee as the present invention.

FIELD OF THE INVENTION

The invention relates to the general field of silicon integrated circuits with particular reference to polysilicon surfaces and capacitors formed thereon.

BACKGROUND OF THE INVENTION

In certain integrated circuits it is required to fabricate a capacitor in series with the gate. The latter is usually made of polysilicon and needs to be heavily doped with a donor material in order to reduce its resistivity. This is commonly achieved by using POCl$_3$ (phosphorus oxychloride) as a diffusion source. Doping in this manner means subjecting the polysilicon gate pedestal to temperatures as high as 950° C. for as long as 15 minutes.

In FIG. 1 we show a schematic view of a capacitor of this type. Source and drain regions 3 and 4 are formed within silicon body 2. Spanning the gap between 3 and 4 is a layer of gate oxide 5 above which is a heavily doped polysilicon pedestal that serves as the gate electrode. Dielectric layer 7 lies atop layer 6 and conductive layer 8 is the counter electrode for the capacitor structure that has thus been formed. Although shown here as a single layer, 7 is often a hybrid of more than one material. For example it could be composed of a layer of silicon oxide topped by a layer of silicon nitride. Regardless of what dielectric material is being used, if there are rough spots on upper surface 9 of poly gate 6, these will act as local high field points at which premature dielectric breakdown will occur.

Polysilicon is normally deposited by CVD (chemical vapor deposition) using silane as the silicon bearing gas. Deposition takes place at about 630° C. Associated with this relatively high temperature is considerable grain growth. This is not, of itself, a problem but, as already mentioned above, the polysilicon gate pedestal still has to undergo POCl$_3$ doping. During the latter procedure, grains of different crystal orientation react somewhat differently to the incoming phosphorus atoms. The net result is a surface that, on a microscale, is quite rough. This roughness (which we measure in Angstroms) is defined by using an AFM (Atomic Force Microscope).

As already noted above, if at least one surface of the capacitor's electrodes is rough, the breakdown voltage of the resulting structure will be lower than is achievable with the materials being used. For example, curve 21 of FIG. 2 is a plot of capacitor leakage current as a function of applied voltage across a capacitor whose lower polysilicon electrode was prepared as described above. The dielectric was 4400 Angstroms thick. Breakdown was defined to have ocurred when the leakage current reached 1 microamp. The breakdown voltage $V_B$ was 60 volts.

Prior art in this area appears to have been focussed on increasing the capacitance per unit area of the capacitors rather than on raising the breakdown voltage. Thus, Zahurak et al. (U.S. Pat. No. 5,639,685 June 1997) disclose a method for increasing the roughness of a polysilicon surface by depositing a thin layer of amorphous silicon onto it and then annealing between about 350 and 600° C. in the presence of a dopant bearing gas. This causes the amorphous silicon to crystallize into hemi-spherical grain polysilicon which leads to an increase in surface area which in turn means a larger capacitance per unit area when a dielectric layer and counter-electrode are deposited over it.

Hayashide et al. (U.S. Pat. No. 5,290,729 March 1994) is similar to Zahurak et al. in that its purpose is also to increase the effective surface area of a capacitor and they achieve this by depositing polysilicon under conditions close to the transition conditions from amorphous to polycrystalline. Lou et al. (U.S. Pat. No. 5,597,754 January 1997) is similar. Increased capacitance is achieved by forming a hemispherically grained surface of polysilicon for the lower electrode. Dennison et al. (U.S. Pat. No. 5,663,090 September 1997) also teach how hemispherical grain silicon may be used as a capacitor electrode.

Chou (U.S. Pat. No. 5,286,668 February 1994) describes a capacitor that is in series with the drain and is located alongside the gate pedestal. By shaping it so that the lower electrode extends upwards and outwards from the drain a capacitor that overhangs the gate is formed. Several different polysilicon layers are used as part of the process.

SUMMARY OF THE INVENTION

It has been an object of the present invention to provide a method for forming a layer of doped polysilicon whose surface has a high degree of smoothness.

Another object of the invention has been to provide a capacitor, along with a method for manufacturing it, that is integrated in a microcircuit as part of the gate circuit and that has a higher breakdown voltage than what has been previously available.

A further object has been that said methods not add to the cost of manufacturing integrated circuits.

These objects have been achieved by depositing the polysilicon layer (from which the gate pedestal is later formed) in two stages. Initially, the conventional deposition temperature of about 630° C. is used. Then, when the intended thickness of polysilicon has been grown, the temperature is ramped down to about 560° C., without interrupting the deposition process, and growth of the film continues to completion. This is followed by a standard doping step using POCl$_3$. Polysilicon films formed in this way have been found to have very smooth surfaces so that dielectric layers obtained by oxidizing them exhibit superior dielectric breakdown voltages.

BRIEF DESCRIPTION OF THE DRAWINGS

FIG. 1 is a schematic representation of a field effect transistor, including a gate pedestal formed according to the teachings of the prior art.

FIG. 2 is a plot of capacitor leakage current vs. applied voltage wherein one electrode is a polysilicon layer formed according to the teachings of the prior art.

DESCRIPTION OF THE PREFERRED EMBODIMENTS

Figure 3:
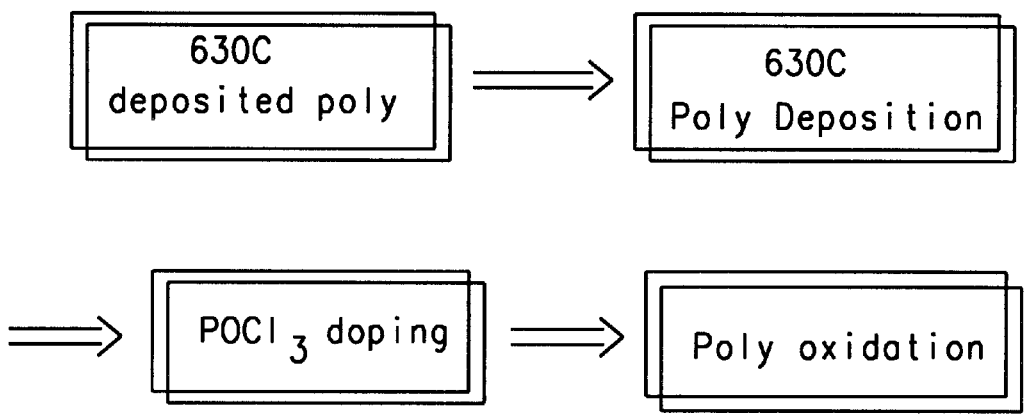
FIG. 3 is a flow chart giving an overview of the process of the present invention.

The present invention discloses a process for forming a phosphorus-doped polysilicon layer having low surface roughness. It is summarised in flow chart form in FIG. 3 and begins with the deposition of a polysilicon layer at a deposition rate between about 60 and 80 Angstroms per minute and at a substrate temperature between about 600 and 650° C., with 630° C. being the preferred temperature.

The key departure from the prior art is that, instead of terminating deposition when the required thickness of polysilicon has been deposited, the temperature is ramped down to a lower temperature that is between about 520 and 580° C., with 560° C. being the preferred temperature, without interrupting the ongoing deposition of the polysilicon.

When the polysilicon is then doped with phosphorus using the normal $POCl_3$ diffusion process, namely $POCl_3$ in a nitrogen carrier at a flow rate around 1,000 SCCM at a temperature around 980° C., the now doped polysilicon is found to have a low roughness value, namely about 78 Angstroms (within a range of 70 to about 90 Angstroms) as compared to about 96 Angstroms roughness seen in doped polysilicon layers prepared according to the prior art.

We have found two sets of conditions for the deposition of the high and low temperature polysilicon to be effective. These are:

(a) The first layer of polysilicon is deposited to a thickness between about 2,000 and 3,800 Angstroms, with 3,150 Angstroms being preferred, while the second layer of polysilicon is deposited for between about 5 and 20 minutes, with 10 minutes being preferred.

(b) The first layer of polysilicon is deposited for between about 20 and 35 minutes, with 30 minutes being preferred, and the second layer of polysilicon is deposited for between about 5 and 70 minutes, with 60 minutes being preferred.

Figure 4:
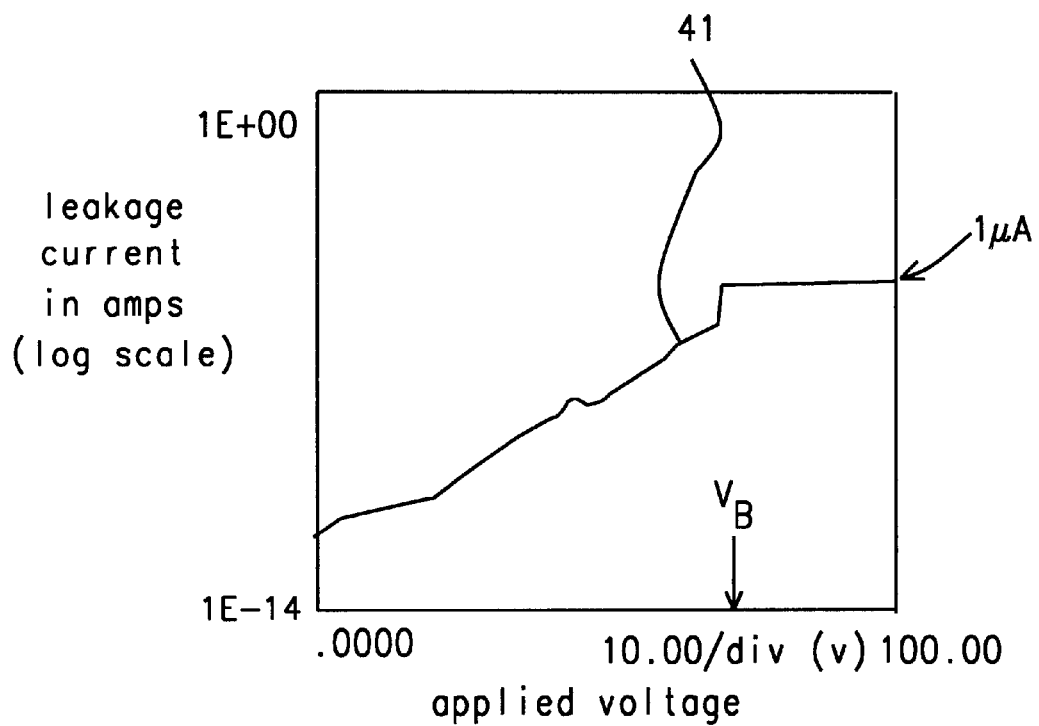
FIG. 4 is a plot of capacitor leakage current vs. applied voltage wherein one electrode is a polysilicon layer formed according to the teachings of the present invention.

In FIG. 4 we show a plot of leakage current vs. applied voltage for the same type of structure used to obtain the data shown in FIG. 2 with the major difference that the FIG. 4 structure was formed according to the teachings of the present invention and therefore had a smoother surface at the polysilicon to dielectric interface. Breakdown was again defined as having ocurred when the leakage current reached 1 microamp. The breakdown voltage $V_B$ in this case was 79 volts, representing a substantial improvement in the capacitor's performance.

Figure 5:
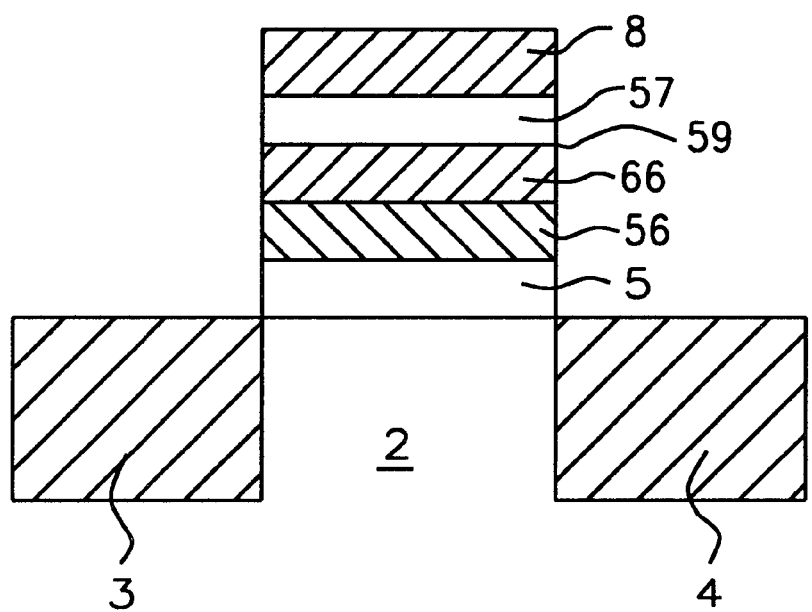
FIG. 5 is a schematic representation of a field effect transistor, including a gate pedestal formed according to the teachings of the present invention.

The above described process for making smooth, $POCl_3$ doped, polysilicon films is readily extended to the formation of capacitors integrated with the gates of field effect transistors in integrated circuits. Starting with a silicon wafer as substrate 2 (in FIG. 5), a layer of gate oxide 5 is grown on the wafer surface. Using deposition rates of the order described above, successive layers of polysilicon 56 and 66 are then deposited, also as described above. In particular, when layer 56's intended thickness has been achieved, the temperature is ramped down to the lower value without interrupting the deposition of the polysilicon.

Once the polysilicon has been deposited as described above, its conductivity is substantially increased by doping it strongly N-type. This is accomplished through diffusion from a phosphorus oxychloride source. The doped polysilicon is then patterned and etched (along with the gate oxide layer 5) to form the polysilicon gate. Source and drain regions 3 and 4, located on either side of the gate, are then formed by means of ion implantation.

The next step is to oxidize the upper surface 59 of the polysilicon pedestal in order to form the capacitor dielectric layer 57. This is accomplished by heating in oxygen for between about 15 and 20 minutes at a temperature between about 900 and 980° C. The thickness of the dielectric layer is between about 80 and 90 Angstroms. As was noted earlier, although shown here as a single layer, layer 57 is often a hybrid of more than one material. For example it could be composed of a layer of silicon oxide topped by a layer of silicon nitride. Other possibilities include TEOS (tetraethyl orthosilicate). Finally, conductive layer 8 is deposited onto dielectric 57 to serve as the counter electrode. Any of a broad selection of materials such as polysilicon, metals, metal alloys, and metal silicides may be used for the counter electrode.

While the invention has been particularly shown and described with reference to the preferred embodiments thereof, it will be understood by those skilled in the art that various changes in form and details may be made without departing from the spirit and scope of the invention.

What is claimed is:

1. A capacitor structure, integrated with a polysilicon gate in a silicon integrated circuit, comprising:

a phosphorus-doped polysilicon gate that consists of a first layer of polysilicon, that was formed at a temperature between about 600 and 650° C., on which lies a second layer of phosphorus-doped polysilicon that was formed at a temperature between about 520 and 580° C., the second polysilicon layer having a thickness between about 2,000 and 3,800 Angstroms;

said first and second polysilicon layers having been formed at the same deposition rate;

a dielectric layer on the second polysilicon layer, wherein the second polysilicon layer having a roughness value that is between about 60 and 80 Angstroms at an interface to said dielectric layer; and a conductive layer on said dielectric layer.

2. The structure of claim 1 wherein the first polysilicon layer has a thickness between about 2,000 and 3,800 Angstroms.

* * * * *